(12) United States Patent
Arnold et al.

(10) Patent No.: US 7,851,830 B2
(45) Date of Patent: Dec. 14, 2010

(54) MULTIGATE SCHOTTKY DIODE

(75) Inventors: Ronald Arnold, Milton Keynes (GB); Dennis Michael Brookbanks, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 0 days.

(21) Appl. No.: 11/944,119

(22) Filed: Nov. 21, 2007

(65) Prior Publication Data
US 2008/0116538 A1      May 22, 2008

(30) Foreign Application Priority Data
Nov. 22, 2006   (GB)   .................. 0623252.4

(51) Int. Cl.
*H01L 29/812*   (2006.01)
(52) U.S. Cl. .................. 257/267; 257/270; 257/280; 257/281; 257/473
(58) Field of Classification Search .................. 257/267, 257/E31.066, 282–284, E31.065, E31.074–E31.076, 257/E29.338, 473, 280, 266
See application file for complete search history.

(56) References Cited

U.S. PATENT DOCUMENTS

| | | | | |
|---|---|---|---|---|
| 4,701,996 A | * | 10/1987 | Calviello | .................. 438/173 |
| 5,814,832 A | * | 9/1998 | Takeda et al. | .................. 257/10 |
| 5,945,701 A | * | 8/1999 | Siergiej et al. | .............. 257/285 |
| 6,501,145 B1 | | 12/2002 | Kaminski et al. | |
| 6,855,981 B2 | * | 2/2005 | Kumar et al. | ................ 257/328 |
| 7,304,336 B2 | * | 12/2007 | Cheng et al. | ................. 257/288 |
| 2005/0263799 A1 | * | 12/2005 | Nakatsuka et al. | .......... 257/266 |

FOREIGN PATENT DOCUMENTS

| | | |
|---|---|---|
| JP | 58201375 | 5/1982 |
| JP | 9223703 | 2/1996 |

OTHER PUBLICATIONS

Search Report dated Mar. 22, 2008 for Application No. GB0722813.3.

* cited by examiner

*Primary Examiner*—Marcos D Pizarro
*Assistant Examiner*—Tifney L Skyles
(74) *Attorney, Agent, or Firm*—Withrow & Terranova, P.L.L.C.

(57) ABSTRACT

A multigate Schottky diode comprising
an electrically conducting active semiconductor region;
first and second electrically connected metallic contact arms on the active semiconductor region forming ohmic contacts therewith;
the ohmic contacts being spaced apart on the active semiconductor region to define a gate receiving channel therebetween.
a plurality of electrically connected metallic gate fingers, the metallic gate fingers being in contact with the active semiconductor region to form Schottky junctions, the Schottky junctions being spaced apart on the active semiconductor region and extending at least partially along the gate receiving channel.

7 Claims, 4 Drawing Sheets

Plan

Cross section

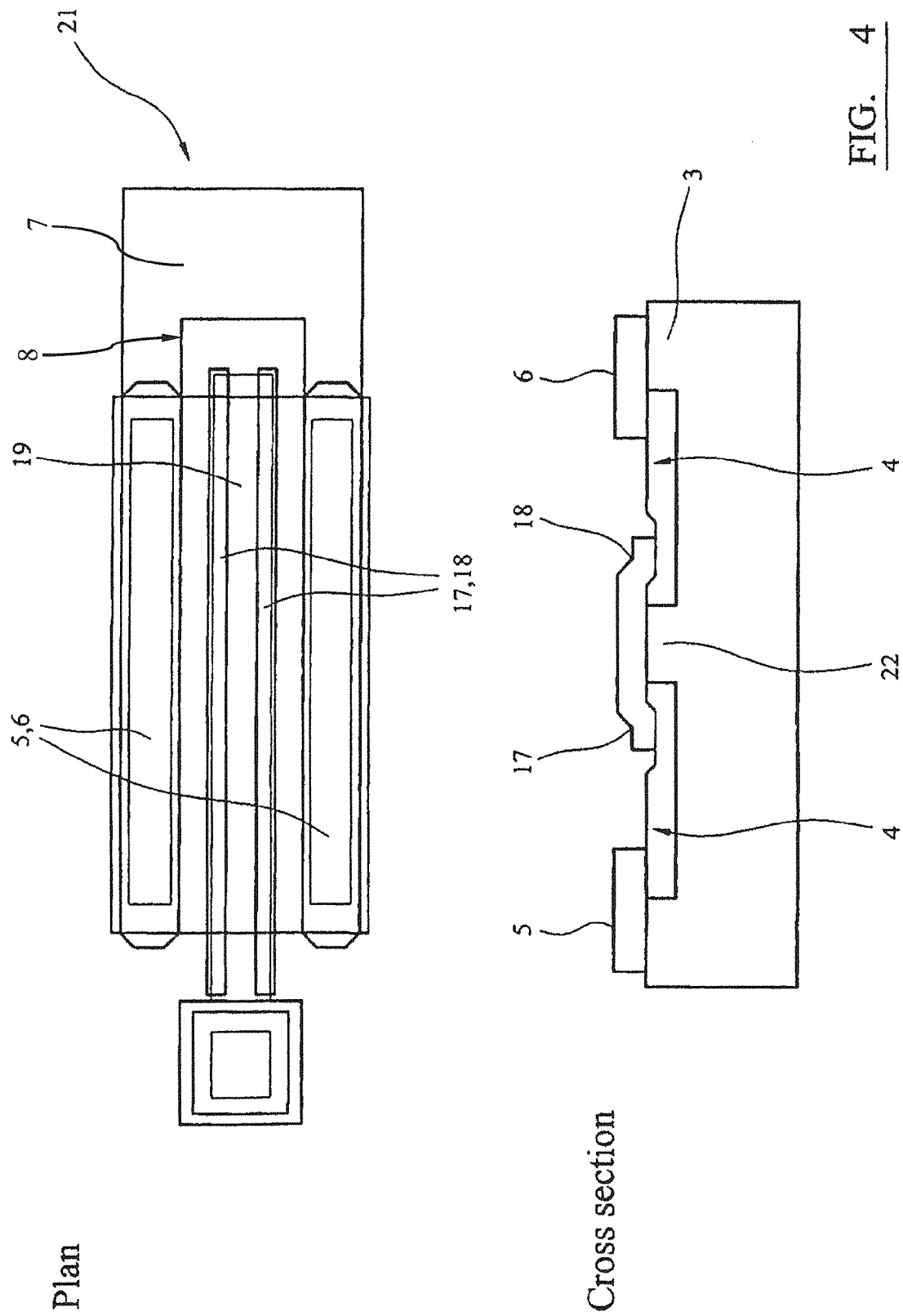

MULTIGATE SCHOTTKY DIODE

The subject patent application claims priority to all the benefits of United Kingdom Patent Application No. 0623252.4, which was filed on 22 Nov. 2006 with The UK Patent Office.

The present invention relates to a multigate Schottky diode. More particularly, but not exclusively, the present invention relates to a multigate Schottky diode having a plurality of spaced apart Schottky junctions on an active semiconductors region connected to form a diode having a greater effective gate length than conventional diodes.

Schottky diodes are known diode devices. The effective gate length of such devices is limited by modern processing techniques. This limits the power handling and robustness of such diodes.

The multigate Schottky diode according to the invention seeks to overcome this problem.

Accordingly, the present invention provides a multigate Schottky diode comprising an electrically conducting active semiconductor region;

first and second electrically connected metallic contact arms on the active semiconductor region forming ohmic contacts therewith;

the ohmic contacts being spaced apart on the active semiconductor region to define a gate receiving channel therebetween.

a plurality of electrically connected metallic gate fingers, the metallic gate fingers being in contact with the active semiconductor region to form Schottky junctions, the Schottky junctions being spaced apart on the active semiconductor region and extending at least partially along the gate receiving channel.

The multigate Schottky diode according to the invention has a larger effective gate length than known Schottky diodes. This increases power handling and robustness which is particularly useful in ESD/Limiter applications.

Preferably, the Schottky junctions are arranged in recesses in the active semiconductor region.

Preferably, the active semiconductor region forms part of a face of a semiconductor substrate, the active semiconductor region being received by an electrically insulating substrate region.

The gate fingers can extend off the active semiconductor region onto the insulating substrate region, the gate fingers being connected together at a fate connector on the insulating substrate region.

Preferably, the contact arms extend off the active semiconductor region onto the insulating substrate region, the contact arms being connected together on the insulating region.

At least two of the gate fingers can be different portions of a single metallic gate strip, a contact portion of the gate strip between the gate fingers being separated from the active semiconductor region.

The multigate Schottky diode can comprise an electrically insulating layer between the contact portion of the gate strip and the active semiconductor region.

Preferably, the insulating substrate region splits the active semiconductor region into sub portions, the gate strip having a gate finger on at least two of the sub portions, the contact portion of the gate strip between these fingers being supported by the insulating substrate region.

Preferably, the active semiconductor region is n doped.

The electrically insulating substrate region can be produced by ion implantation.

The present invention will now be described by way of example only and not in any limitative sense with reference to the accompanying drawings which FIG. 1 shows a known single gate Schottky diode;

Figure 1:
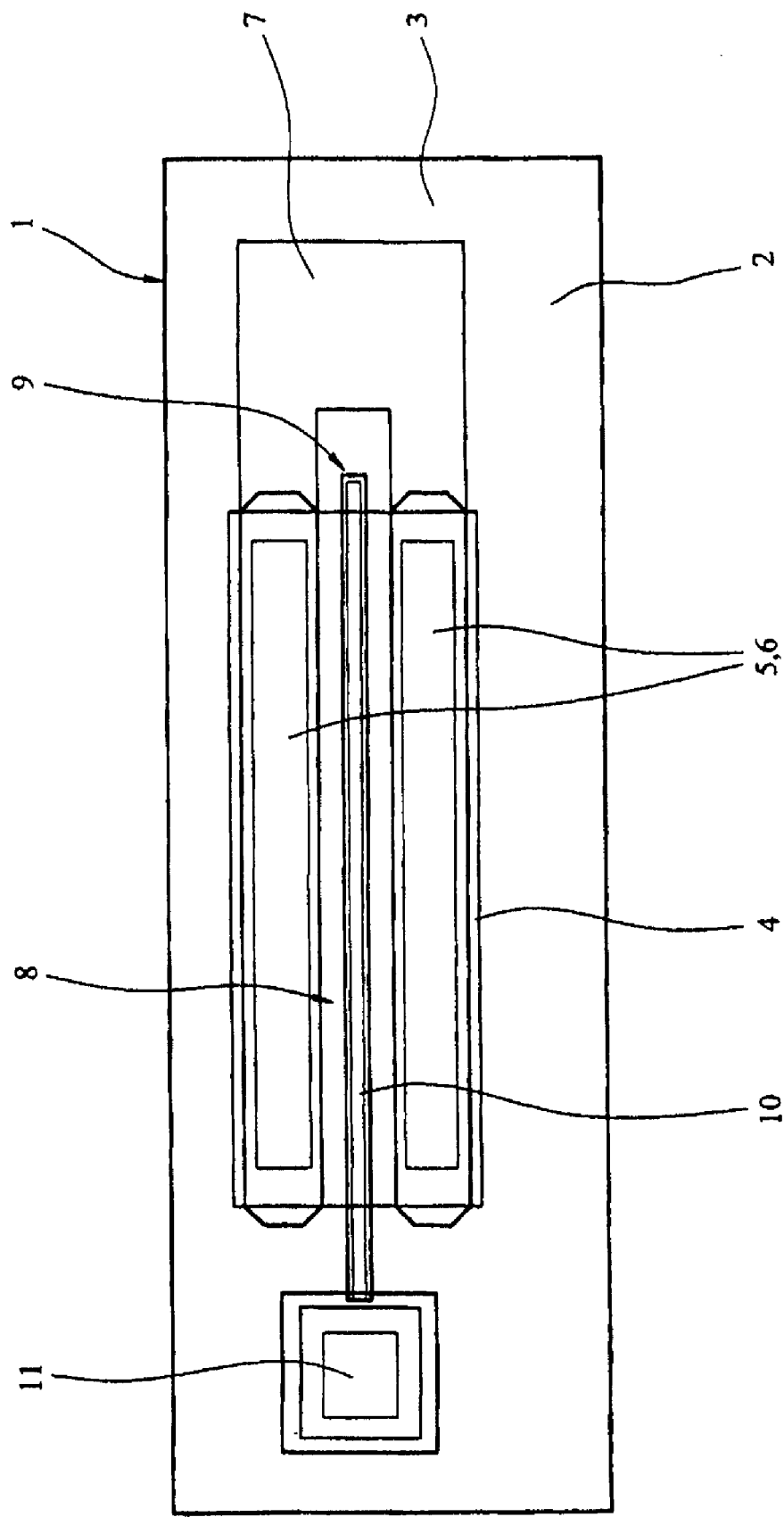

Shown in FIG. 1 is a known single gate Schottky diode 1. The diode 1 comprises a semiconductor substrate 2 having an insulating region 3. The insulating region 3 is formed by ion implantation. One face of the semiconductor substrate 2 comprises an active semiconductor region 4. The active semiconductor region 4 is one which is doped to be electrically conducting.

On the active region 4 are first and second metallic contact arms 5, 6. The metal of the contact arms 5, 6 is chosen such that they form ohmic contacts with the active semiconductor region 4. Both of the contact arms 5, 6 extend off the active semiconductor region 4 onto the insulating region 3 where they are connected together at a base 7.

The contact arms 5, 6 between them define a gate receiving channel 8. A recess 9 in the active semiconductor region 4 extends along the gate receiving channel 8. Positioned within the recess is a metallic gate finger 10. The metal of the gate finger 10 is chosen so as to form a Schottky junction with the active semiconductor region 4. The gate finger 10 extends off the active semiconductor region 4 onto the insulating region 3 where it is connected to a gate connection 11 as shown.

The operation of such a Schottky diode 1 is known and will not be described in detail.

Gates having a large effective gate lengths are desirable in applications such as limiters or ESD protection. Schottky diodes are however manufactured by methods involving etching. Etch rates depend upon the surface area being etched. If one attempts to etch a wide area for a gate having a large affective width the resulting trench will have an uneven depth resulting in a diode with poor performance. Known Schottky diodes are therefore limited to short effective gate lengths which do not require large etching areas.

Figure 2:
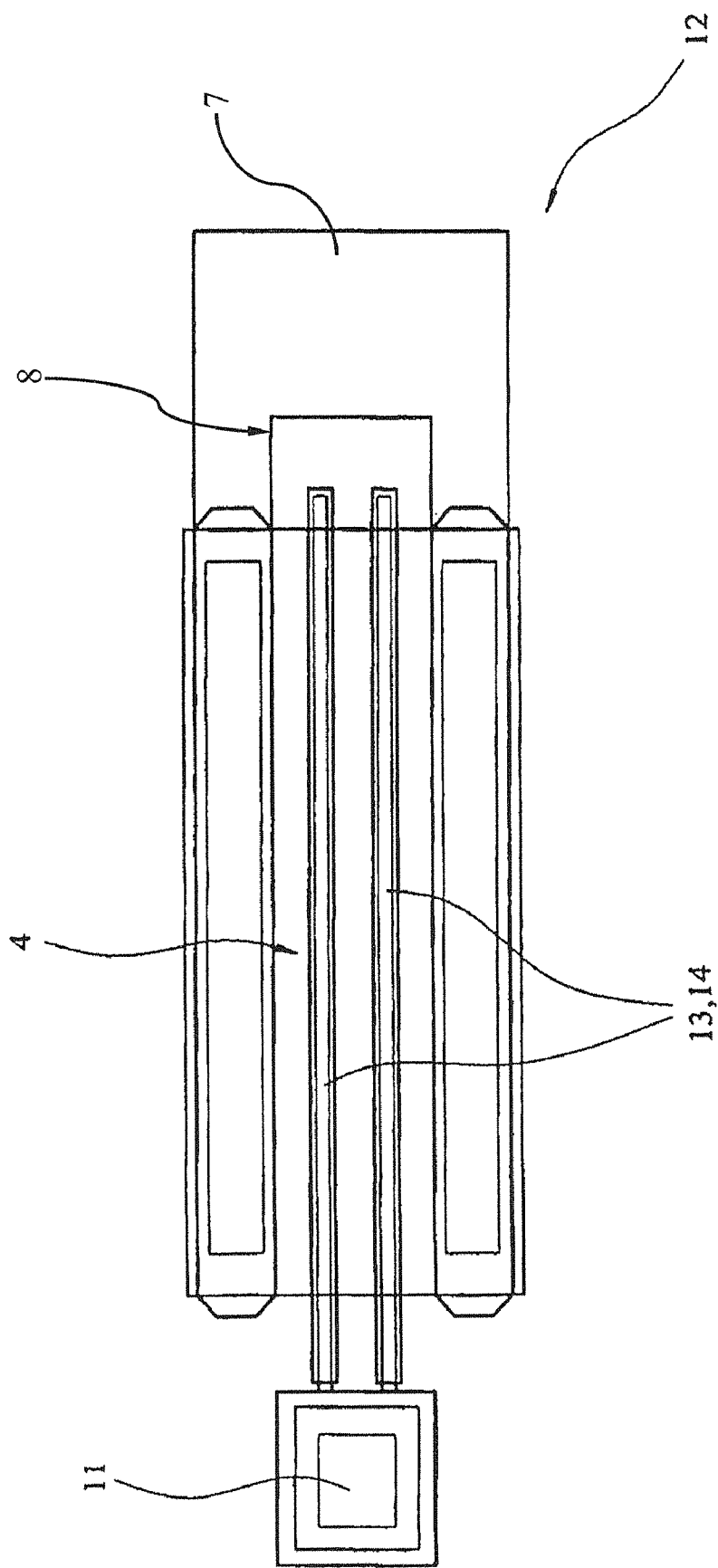
FIG. 2 shows a first embodiment of a multigate Schottky diode according to the invention.

Shown in FIG. 2 is a multigate Schottky diode 12 according to the invention. In contrast to the diode 1 of FIG. 1 the diode 12 comprises two parallel spaced apart gate fingers 13, 14 each of which forms a Schottky junction with the underlying active semiconductor region 4. The gate fingers 13, 14 are connected together at the gate connection 11 on the insulating region 3 of the semiconductor substrate. Such a Schottky diode 12 has the advantage that the arrangement of the gate fingers 13, 14 results in a diode having an effective gate width greater than gate widths for existing Schottky diodes. Such a diode 12 has particular application in limiters and ESD protection.

Figure 3:
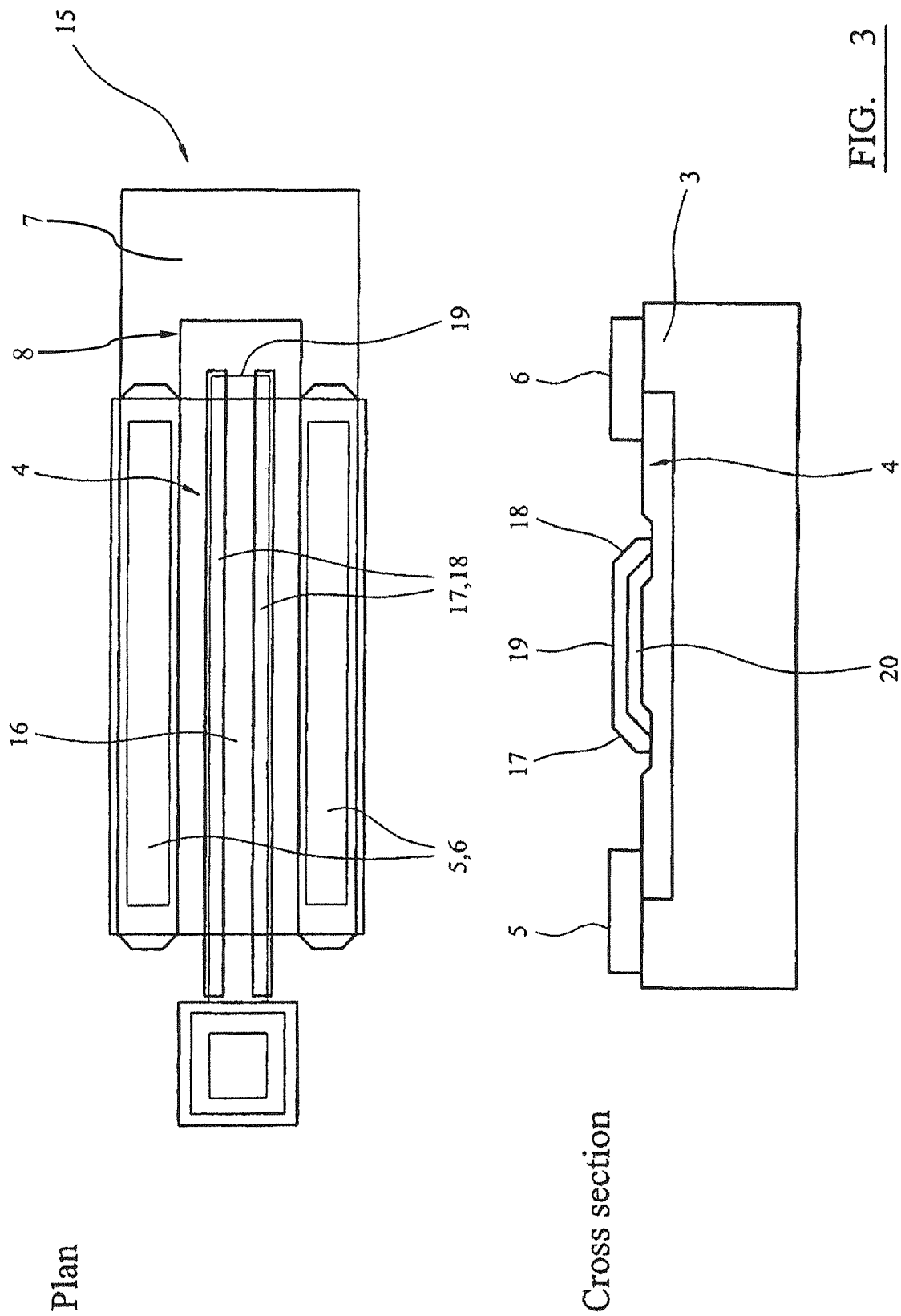
FIG. 3 shows a further embodiment of a multigate Schottky diode according to the invention; and, FIG. 4 shows a further embodiment of a multigate Schottky diode according to the invention.

Shown in FIG. 3 is a further embodiment of a Schottky diode 15 according to the invention. The diode 15 of this embodiment comprises an electrically conducting gate strip 16 which extends along the gate receiving channel 8. Each side of the strip 16 forms a gate finger 17, 18 in contact with the active semiconductor region 4 to form parallel Schottky junctions. A contact portion 19 of the gate strip 16 extends between the gate fingers 17, 18. The contact portion 19 is separated from the active semiconductor region 4 by an insulating layer 20. Again, the Schottky diode 15 has an effective gate width larger than that of existing Schottky diodes.

Shown FIG. 4 is a further embodiment of a Schottky diode 21 according to the invention. In this embodiment the insulating portion 3 of the substrate divides the active region 4 into sub regions as shown. An ohmic contact 5 is connected to each region 4. A gate strip 16 spans the gap between the active regions 4. One gate finger portion 17, 18 of the gate strip 16 contacts each of the sub portions of the active region 4 forming Schottky junctions. The insulating portion 22 between the sub regions supports the contact portion 19 of the gate strip 16 as shown.

The above embodiments have been shown with two gate fingers only. Other embodiments having more than two gate fingers are also possible.

The invention claimed is:

1. A multigate Schottky diode comprising:
    an electrically conducting active semiconductor region that forms part of the semiconductor substrate, such that an electrically insulating substrate region splits the active semiconductor region into sub portions;
    first and second metallic contact arms on the active semiconductor region forming ohmic contacts therewith, the ohmic contacts being spaced apart on the active semiconductor region to define a gate receiving channel therebetween;
    a base, which electrically connects the first metallic contact arm to the second metallic contact arm; and
    a single metallic gate strip comprising:
        a plurality of metallic gate fingers, such that a gate finger is on at least two of the sub portions, the metallic gate fingers being electrically connected to one another by the single metallic gate strip and being in contact with the active semiconductor region to form Schottky junctions, the Schottky junctions being spaced apart on the active semiconductor region and extending at least partially along the gate receiving channel; and
        a contact portion at least partially along the gate receiving channel and between the metallic gate fingers is supported directly by the insulating substrate region, such that the contact portion is separated from the active semiconductor region.

2. A multigate Schottky diode as claimed in claim 1, the Schottky junctions being arranged in recesses in the active semiconductor region.

3. A multigate Schottky diode as claimed in claim 1, wherein the active semiconductor region forms part of a face of the semiconductor substrate, the active semiconductor region being received by the electrically insulating substrate region.

4. A multigate Schottky diode as claimed in claim 3, wherein the gate fingers extend off the active semiconductor region onto the insulating substrate region, the gate fingers being connected together at a gate connector on the insulating substrate region.

5. A multigate Schottky diode as claimed in claim 3, wherein the contact arms extend off the active semiconductor region onto the insulating substrate region, the contact arms being connected together on the insulating region.

6. A multigate Schottky diode as claimed in claim 1, wherein the active semiconductor region is n doped.

7. A multigate Schottky diode as claimed in claim 1, wherein the active semiconductor region is received by an ion implanted electrically insulating substrate region.

\* \* \* \* \*